United States Patent [19]
Eribes

[11] Patent Number: 6,121,845
[45] Date of Patent: Sep. 19, 2000

[54] PHASE-LOCKED LOOP SYSTEM AND METHOD FOR MODIFYING AN OUTPUT TRANSITION TIME

[75] Inventor: Ruben Eribes, Chandler, Ariz.

[73] Assignee: Motorola, Inc., Schaumburg, Ill.

[21] Appl. No.: 09/079,843

[22] Filed: May 15, 1998

[51] Int. Cl.[7] ................................................ H03L 7/00
[52] U.S. Cl. .............................. 331/25; 331/11; 331/1 A; 327/156; 327/158; 327/159
[58] Field of Search ................................ 331/1 A, 25, 11; 327/156, 158, 159

[56] References Cited

U.S. PATENT DOCUMENTS

| | | | |
|---|---|---|---|
| 5,180,992 | 1/1993 | Akiyama et al. | 331/11 |
| 5,339,278 | 8/1994 | Irwin et al. | 331/16 |
| 5,541,929 | 7/1996 | Jokura | 331/25 X |
| 5,592,113 | 1/1997 | Quiet et al. | 327/158 |

*Primary Examiner*—Arnold Kinkead
*Attorney, Agent, or Firm*—Anthony M. Martinez

[57] ABSTRACT

A Phase-Locked Loop (PLL) system (30) and a method for modifying the output transition time of the PLL system (30). The PLL system has an input stage (36) connected to a PLL (37). The input stage (36) includes a phase detector stage (47), a phase difference threshold stage (48), and a phase difference modification stage (49). The input stage (36) receives a reference input signal and a feedback input signal and determines the phase difference between these two input signals. If the phase difference is greater than a predetermined value, then the input stage (36) decreases the phase difference between the reference input signal and the feedback input signal. If the phase difference is less than the predetermined value, then the phase difference between the reference input signal and the feedback input signal is not modified.

19 Claims, 3 Drawing Sheets

*-PRIOR ART-*

PHASE-LOCKED LOOP SYSTEM AND METHOD FOR MODIFYING AN OUTPUT TRANSITION TIME

FIELD OF THE INVENTION

The present invention relates, in general, to integrated circuits and, more particularly, to Phase-Locked Loop (PLL) integrated circuits.

BACKGROUND OF THE INVENTION

Communications systems and computer systems have components that operate at different speeds. Typically, these systems use Phase-Locked Loops (PLLs) for synchronization of their components. A PLL generally includes a phase detector, a loop filter, a Voltage-Controlled Oscillator (VCO), and a loop divider. The phase detector provides a phase detect output signal that indicates the phase difference between a loop clock signal and a reference clock signal. The phase detector provides the phase detect output signal to an input of the loop filter, which in turn provides a filtered signal to the VCO. The filtered signal indicates the length of time that the two clock signals are out of phase. The VCO provides a clock output signal having a desired frequency. The clock output signal is divided by the loop divider to provide the loop clock signal.

In a portable computer system, power is conserved by reducing the clock rates of some of its components. For example, in a computer system designed to operate at 66 MegaHertz (MHz), some components, such as timing clocks, can be maintained at a lower clock rate of 32 MHz when the computer is not in use. Problems in synchronization can occur if the output frequency of the PLL changes from a higher to a lower frequency before downstream components are ready to accept the altered output frequency. In one example, a downstream component that requires a delay on the order of milliseconds before receiving the changed input frequency may be coupled to a PLL that switches from one frequency to another within a few microseconds. The timing difference can lead to race conditions, code execution failure, improper turning on or turning off of buses, etc.

One method for delaying the change in output frequency of the PLL is to delay the filtered signal transmitted to the VCO from the loop filter. This can be done by increasing the capacitance of the loop filter. To achieve a timing delay on the order of milliseconds, one or more microfarad-sized capacitors are needed. In the field of monolithic integrated circuits, where space on a chip is limited, the addition of one or more microfarad-sized capacitors restricts a circuit designer's options with regard to other components. It also increases the cost of the chip. Another disadvantage of this approach, is that modifying components of the PLL can adversely affect the gain and the operating bandwidth of the PLL, resulting in signal jitter at the output of the PLL.

Accordingly, it would be advantageous to have a PLL and method for altering the time it takes for the PLL to transition from one frequency to another. It would be of further advantage for the PLL to be area and cost efficient.

DETAILED DESCRIPTION OF THE DRAWINGS

Generally, the present invention provides a Phase-Locked Loop (PLL) system and a method for altering or modifying the output transition time of the PLL system. The output transition time of the PLL system is the amount of time it takes for the output of the PLL system to transition from one lock frequency to another lock frequency. The present invention includes an input stage coupled to a PLL for modifying the output transition time of the PLL system. The input stage receives a reference input signal and a feedback input signal and determines the phase difference between these two input signals. If the phase difference is greater than a predetermined value, then the input stage decreases the phase difference between the reference input signal and the feedback input signal. If the phase difference is less than the predetermined value, then the phase difference between the reference input signal and the feedback input signal is not modified. Modifying the phase difference between the reference input signal and the feedback input signal in this fashion alters the output transition time of the PLL system. This is advantageous for synchronization of components in systems employing PLLs.

Figure 1:
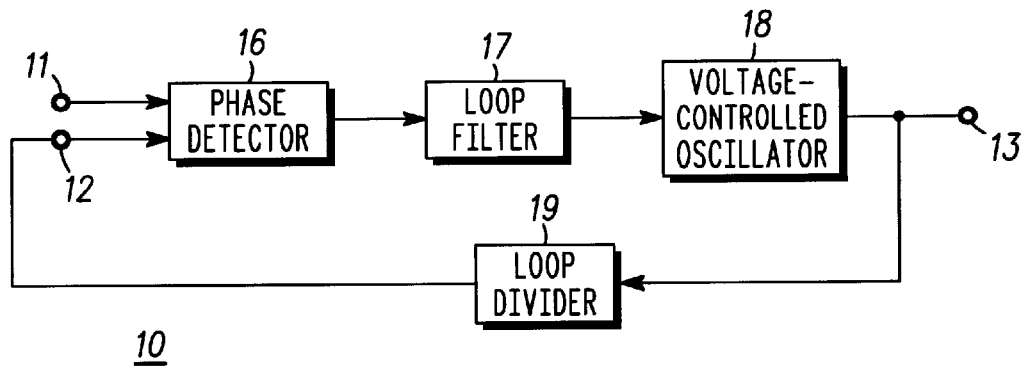
FIG. 1 is a block diagram of a prior art Phase-Locked Loop (PLL)

FIG. 1 is a block diagram of a prior art PLL 10 having a reference input terminal 11, a feedback input terminal 12, and an output terminal 13. PLL 10 includes a phase detector 16, a loop filter 17, a Voltage-Controlled Oscillator (VCO) 18, and a loop divider 19. Phase detector 16 has a reference input terminal connected to reference input terminal 11, a feedback input terminal connected to feedback input terminal 12, and an output terminal. The output terminal of phase detector 16 is connected to the input terminal of loop filter 17 and the output terminal of loop filter 17 is connected to the input terminal of VCO 18. The output terminal of VCO 18 is commonly connected to output terminal 13 and to the input terminal of loop divider 19. The output terminal of loop divider 19 is connected to feedback input terminal 12.

In operation, reference input terminal 11 receives a reference input signal and feedback input terminal 12 receives a feedback input signal. Phase detector 16 generates a phase detect signal and transmits the phase detect signal to the input terminal of loop filter 17. The phase detect signal indicates the phase difference between the feedback input signal and the reference input signal. Loop filter 17 generates a Direct Current (DC) signal by filtering out the Alternating Current (AC) component of the phase detect signal leaving only the DC component of the phase detect signal. The DC signal is transmitted to the input terminal of VCO 18 from the output terminal of loop filter 17. The magnitude of the DC signal is a function of the phase difference between the reference input signal and the feedback input signal. VCO 18 generates a clock output signal having a frequency. The frequency of the clock output signal is divided by loop divider 19 to generate the feedback input signal. Therefore, PLL 10 can generate the clock output signal having a frequency that is many times greater than that of the reference input signal. Alternatively, loop divider 19 can be omitted and the output terminal of VCO 18 can be connected to feedback input terminal 12. Thus, the clock output signal is transmitted to feedback input terminal 12.

As the phase difference between the reference input signal and the feedback input signal increases, the change in average current supplied to loop filter 17 increases. As is well known, changing the magnitude of the DC signal transmitted to VCO 18 changes the frequency of the VCO output signal. PLL 10 changes the frequency of the clock output signal until the reference input signal and the feedback input signal have essentially the same frequency and phase, i.e., PLL 10 is "locked." In many prior art PLL circuits, as the phase difference between the two input signals increases, the voltage applied to their VCOs increases proportionally. Thus, large phase differences induce a large change in the frequency of the clock output signal. This may cause problems in systems using PLL circuits for synchronization of their components.

Figure 2:
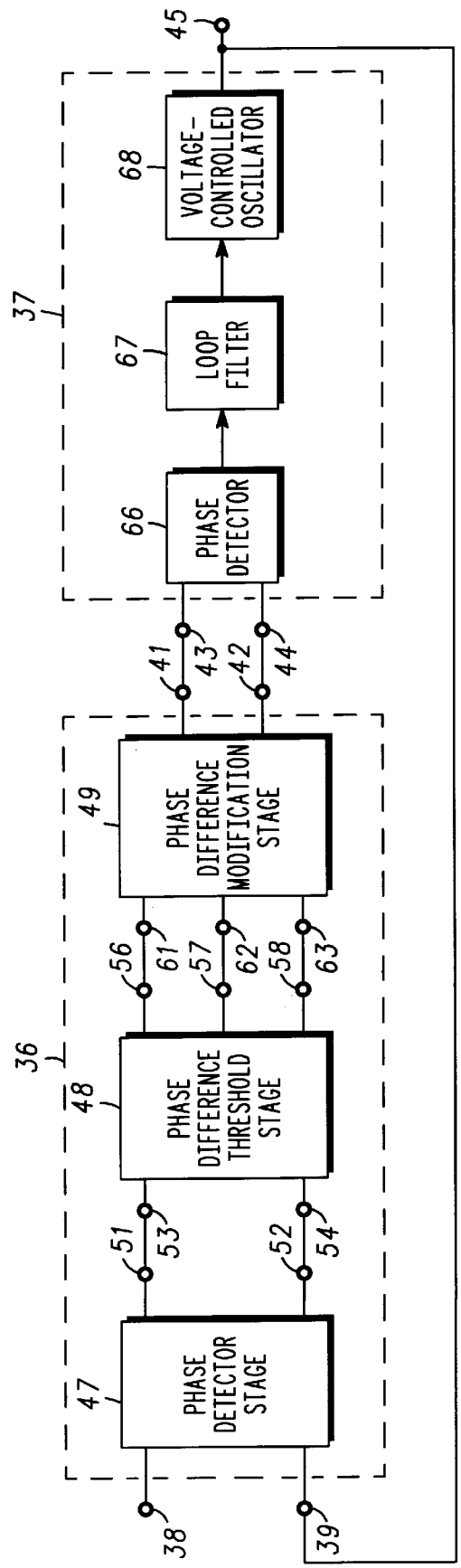
FIG. 2 is a block diagram of a PLL system in accordance with an embodiment of the present invention.

FIG. 2 is a block diagram of a PLL system 30 in accordance with an embodiment of the present invention. PLL system 30 includes an input stage 36 connected to a PLL 37. More particularly, input stage 36 has a reference input terminal 38, a feedback input terminal 39, a reference output terminal 41, and a feedback output terminal 42. PLL 37 has a reference input terminal 43 connected to reference output terminal 41, a feedback input terminal 44 connected to feedback output terminal 42, and an output terminal 45 connected to feedback input terminal 39.

Input stage 36 is referred to as a phase difference control stage and includes a phase detector stage 47, a phase difference threshold stage 48, and a phase difference modification stage 49. Phase detector stage 47 has a reference input terminal connected to reference input terminal 38, a feedback input terminal connected to feedback input terminal 39, a reference output terminal 51, and a feedback output terminal 52. Phase difference threshold stage 48 has a reference input terminal 53 connected to reference output terminal 51, a feedback input terminal 54 connected to feedback output terminal 52, a reference output terminal 56, a control output terminal 57, and a feedback output terminal 58. Phase difference modification stage 49 has a reference input terminal 61 connected to reference output terminal 56, a control input terminal 62 connected to control output terminal 57, a feedback input terminal 63 connected to feedback output terminal 58, a reference output terminal connected to reference output terminal 41, and a feedback output terminal connected to feedback output terminal 42.

PLL 37 includes a phase detector 66, a loop filter 67, and a Voltage-Controlled Oscillator (VCO) 68. Phase detector 66 has a reference input terminal connected to reference input terminal 43, a feedback input terminal connected to feedback input terminal 44, and an output terminal connected to the input terminal of loop filter 67. The output terminal of loop filter 67 is connected to the input terminal of VCO 68 and the output terminal of VCO 68 is connected to output terminal 45.

In operation, reference input terminal 38 receives a reference signal and feedback input terminal 39 receives a feedback signal. Input stage 36 determines the phase difference between the feedback signal and the reference signal. If the phase difference between the reference signal and the feedback signal is greater than a predetermined value, then the phase difference between the reference signal and the feedback signal is decreased by altering either the reference signal or the feedback signal. On the other hand, if the phase difference between the reference signal and the feedback signal is less than the predetermined value, then the phase difference between the reference signal and the feedback signal is not modified.

In this example, phase detector stage 47 determines the phase difference with respect to the rising edges of the reference signal and the feedback signal. Threshold stage 48 determines if the phase difference is greater than or less than a predetermined value of, for example, approximately ±15°. If the phase difference between the reference signal and the feedback signal is greater than the predetermined value, then control output terminal 57 is asserted or activated by threshold stage 48; thereby asserting control input terminal 62. Control input terminal 62 is asserted by transmitting a control signal to control input terminal 62 from control output terminal 57, wherein the control signal is set to a logic high voltage by threshold stage 48. If the phase difference between the reference signal and the feedback signal is less than the predetermined value, then control input terminal 62 is not asserted or de-asserted, i.e., the control signal is set to a logic low voltage. By way of example, a logic high voltage has a nominal value of approximately five volts and a logic low voltage has a nominal value of approximately zero volts. As those skilled in the art are aware, a logic high voltage is also referred to as a logic high, a logic one, or a logic one signal and a logic low voltage is also referred to as a logic low, a logic zero, or a logic zero signal.

When the phase difference between the rising edges of the reference signal and the feedback signal is greater than a predetermined value, modification stage 49 decreases the phase difference between the rising edges. If the rising edge of the feedback signal lags the rising edge of the reference signal, the phase difference is modified by altering the rising edge of the feedback signal and leaving the rising edge of the reference signal unaltered. It should be understood that altering the rising edge of the feedback signal means moving the position of the rising edge of the feedback signal relative to the position of the rising edge of the reference signal to decrease the phase difference between the rising edges. The altered feedback signal is transmitted from feedback output terminal 42 to feedback input terminal 44 and the unaltered reference signal is transmitted from reference output terminal 41 to reference input terminal 43. On the other hand, if the rising edge of the feedback signal leads the rising edge of the reference signal, i.e., the rising edge of the reference signal lags the rising edge of the feedback signal, the phase difference is modified by altering the rising edge of the reference signal and leaving the rising edge of the feedback signal unaltered. The altered reference signal is transmitted from reference output terminal 41 to reference input terminal 43 and the unaltered feedback signal is transmitted from feedback output terminal 42 to feedback input terminal 44.

In either case, i.e., if the phase difference is greater than or less than the predetermined value, reference input terminal 43 receives a reference signal, either altered or unaltered, from reference output terminal 41. Similarly, feedback input terminal 44 receives a feedback signal, either altered or unaltered, from feedback output terminal 42. The operation of PLL 37, and more particularly, the operations of phase detector 66, loop filter 67, and VCO 68 are similar to the operations of PLL 10, phase detector 16, loop filter 17, and VCO 18, respectively. PLL 37 changes the frequency of the clock output signal until the clock output signal and the reference signal at input terminal 43 have essentially the same frequency.

Input stage 36 increases the output transition time of PLL system 30 by decreasing the phase difference between the reference signal and the feedback signal when the phase difference is greater than the predetermined value. The output transition time of PLL system 30 is the time it takes for the clock output signal to transition from one lock frequency to another lock frequency. The effect of input stage 36 on the output transition time of PLL system 30 is illustrated in FIG. 3.

Figure 3:
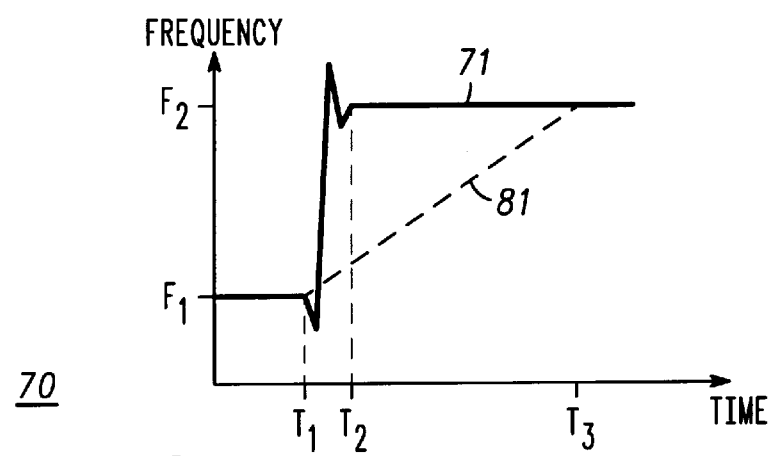
FIG. 3 is a plot of frequency versus time for two clock output signals of the PLL system of FIG. 2.

FIG. 3 is a plot 70 of frequency versus time for clock output signals 71 and 81 at output terminal 45 of PLL system 30 (FIG. 2). Clock output signal 71 is denoted by a solid line and clock output signal 81 is denoted by a dashed line. $T_1$, $T_2$, and $T_3$ denote time along the TIME axis. $F_1$ and $F_2$ denote two lock frequencies along the FREQUENCY axis. When input stage 36 is disabled and receives a reference signal and a feedback signal having a phase difference between their rising edges that is greater than the predetermined value, clock output signal 71 is generated at output terminal 45. On the other hand, when input stage 36 is enabled and receives the same reference and feedback signals described hereinbefore, clock output signal 81 is generated at output terminal 45.

By way of example, input stage 36 is disabled by disabling phase difference modification stage 49. When modification stage 49 is disabled, the rising edge of the received reference signal is unaltered and transmitted to reference input terminal 43 and the rising edge of the received feedback signal is unaltered and transmitted to feedback input terminal 44. Clock output signal 71 transitions from a first lock frequency $F_1$ to a second lock frequency $F_2$. At time $T_1$, clock output signal 71 is at lock frequency $F_1$. Between times $T_1$ and $T_2$, clock output signal 71 transitions from lock frequency $F_1$ to lock frequency $F_2$. At time $T_2$, clock output signal 71 is at lock frequency $F_2$. When input stage 36 is disabled, the output transition time of PLL system 30 is the amount of time between time $T_1$ and time $T_2$, i.e., the difference between times $T_1$ and $T_2$. Some overshoot and undershoot is noticeable in clock output signal 71 during the transition of clock output signal 71 from lock frequency $F_1$ to lock frequency $F_2$.

When input stage 36 is enabled and the phase difference between the rising edges of the reference and feedback signals is greater than the predetermined value, input stage 36 decreases the phase difference between the reference and feedback signals. At time $T_1$, clock output signal 81 is equal to lock frequency $F_1$. Between times $T_1$ and $T_3$, clock output signal 81 transitions from lock frequency $F_1$ to lock frequency $F_2$. At time $T_3$, clock output signal 81 is equal to lock frequency $F_2$. When input stage 36 is enabled, the output transition time of PLL system 30 is the amount of time between time $T_1$ and time $T_3$.

As illustrated in FIG. 3, the output transition time of PLL system 30 is increased by enabling input stage 36. It should be noted that since input stage 36 is connected to the input terminals of PLL 37 and the components of PLL 37 are not modified, the gain and operating bandwidth of PLL 37 are not substantially affected by the addition of input stage 36. In some prior art PLLs, modifying the components of a PLL alters the gain and the operating bandwidth of the PLL which can result in increased signal jitter at the output of the PLL.

Modifying the output transition time of a PLL system is also referred to as altering the output frequency slew rate of the PLL system. The output frequency slew rate of the PLL system is the rate at which the output of the PLL system transitions from one frequency to another frequency. Referring to clock signals 71 and 81 of FIG. 3, it can be observed that the rate of change for the clock output signal of PLL system 30, in terms of frequency per unit time, is decreased when input stage 36 is enabled.

Figure 4:
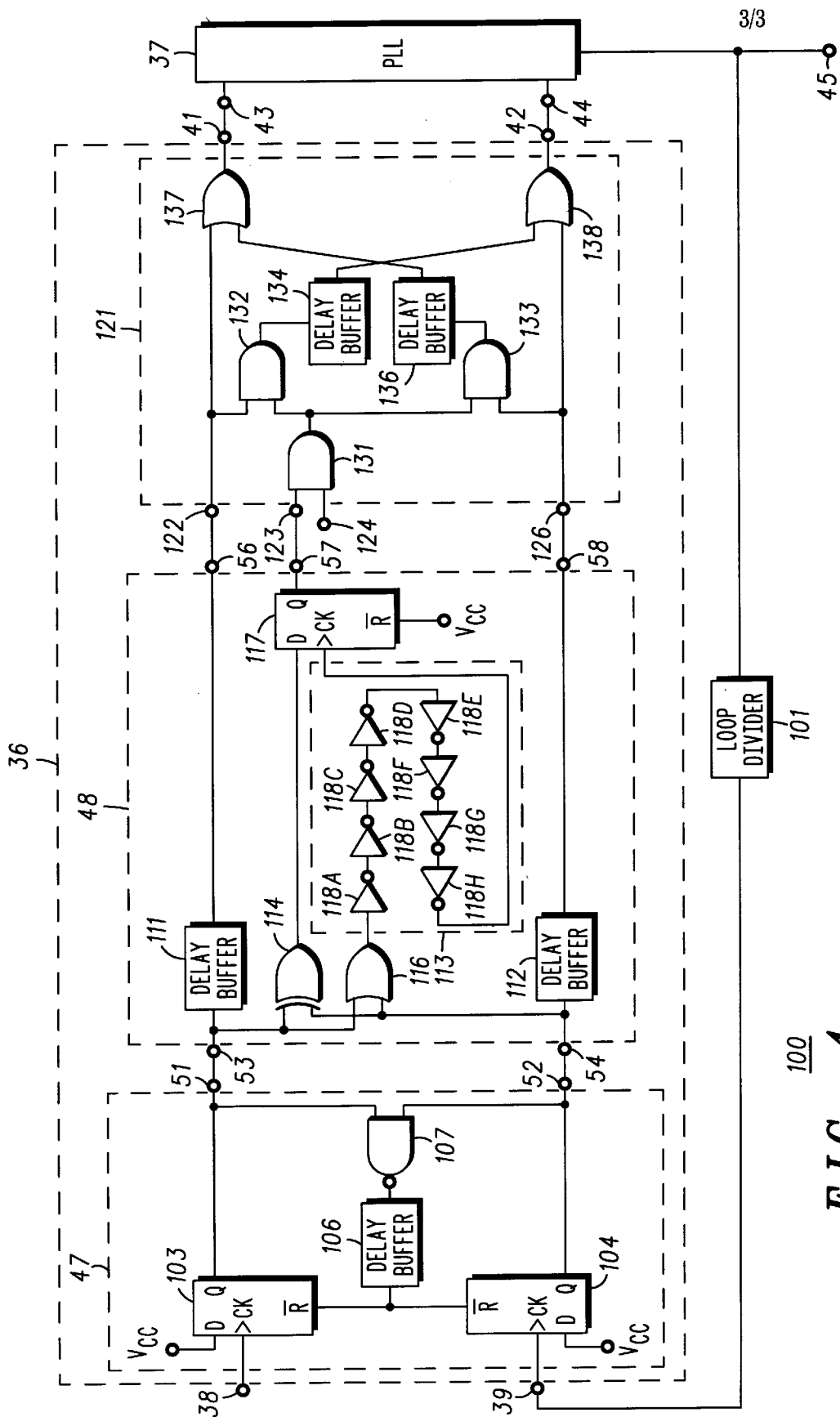
FIG. 4 is a block diagram of a PLL system in accordance with the present invention.

FIG. 4 is a block diagram of a PLL system 100 in accordance with the present invention. It should be understood that the same reference numerals are used in the figures to denote the same elements. PLL system 100 includes input stage 36 and PLL 37. As an optional feature, output terminal 45 is coupled to feedback input terminal 39 via a loop divider 101. With loop divider 101, PLL system 100 can generate a clock output signal at output terminal 45 having a frequency that is greater than that of a reference input signal received at input terminal 38.

Input stage 36 includes phase detector stage 47, phase difference threshold stage 48, and a phase difference modification stage 121. Phase detector stage 47 includes two flip-flops 103 and 104, a NAND gate 107, and a delay buffer 106. By way of example, flip-flops 103 and 104 are D-type flip-flops each having a data input terminal labeled "D," a true clock input terminal labeled "CK," a complementary reset input terminal labeled "$\overline{R}$," and a true output terminal labeled "Q." Terminal D of flip-flop 103 is coupled for receiving a source of operating potential or power supply voltage such as, for example, a voltage Vcc. Input terminal CK of flip-flop 103 is connected to reference input terminal 38 and output terminal Q of flip-flop 103 is commonly connected to reference output terminal 51 and to the first input terminal of NAND gate 107.

Terminal D of flip-flop 104 is coupled for receiving a power supply voltage such as, for example, voltage Vcc. Input terminal CK of flip-flop 104 is connected to feedback input terminal 39 and output terminal Q of flip-flop 104 is commonly connected to the second input terminal of NAND gate 107 and to feedback output terminal 52.

The output terminal of NAND gate 107 is connected to the input terminal of delay buffer 106 and the output terminal of delay buffer 106 is commonly connected to input terminal $\overline{R}$ of flip-flop 103 and to input terminal $\overline{R}$ of flip-flop 104.

Threshold stage 48 includes delay buffers 111, 112, and 113, an exclusive-OR (XOR) gate 114, an OR gate 116, and a D-type flip-flop 117. Delay buffer 113 is comprised of a plurality of inverters 118A, 118B, 118C, 118D, 118E, 118F, 118G, and 118H which are serially connected to each other. Reference input terminal 53 is commonly connected to the input terminal of delay buffer 111, the first input terminal of XOR gate 114, and the first input terminal of OR gate 116. The output terminal of delay buffer 111 is connected to reference output terminal 56. Feedback input terminal 54 is commonly connected to the input terminal of delay buffer 112, the second input terminal of XOR gate 114, and the second input terminal of OR gate 116. The output terminal of delay buffer 112 is connected to feedback output terminal 58. The output terminal of OR gate 116 is connected to the input terminal of delay buffer 113 and the output terminal of delay buffer 113 is connected to input terminal CK of flip-flop 117. The output terminal of XOR gate 114 is connected to input terminal D of flip-flop 117. Output terminal Q of flip-flop 117 is connected to control output terminal 57 and input terminal $\overline{R}$ of flip-flop 117 is coupled for receiving a power supply voltage such as, for example, voltage Vcc.

Modification stage 121 has a reference input terminal 122 connected to reference output terminal 56, a control input terminal 123 connected to control output terminal 57, an enable input terminal 124, and a feedback input terminal 126 connected to feedback output terminal 58. In addition, modification stage 121 has a reference output terminal connected to reference output terminal 41 and a feedback output terminal connected to feedback output terminal 42. Modification stage 121 includes AND gates 131, 132, and 133, delay buffers 134 and 136, and OR gates 137 and 138. Reference input terminal 122 is commonly connected to the first input terminal of AND gate 132 and the first input terminal of OR gate 137. The output terminal of OR gate 137 is connected to reference output terminal 41. Control input terminal 123 is connected to the first input terminal of AND gate 131 and enable input terminal 124 is connected to the second input terminal of AND gate 131. The output terminal of AND gate 131 is commonly connected to the second input terminal of AND gate 132 and to the first input terminal of AND gate 133. The output terminal of AND gate 132 is connected to the input terminal of delay buffer 134 and the output terminal of delay buffer 134 is connected to the first input terminal of OR gate 138. The output terminal of OR gate 138 is connected to feedback output terminal 42. Feedback input terminal 126 is commonly connected to the second input terminal of AND gate 133 and to the second input terminal of OR gate 138. The output terminal of AND gate 133 is connected to the input terminal of delay buffer 136 and the output terminal of delay buffer 136 is connected to the second input terminal of OR gate 137. It should be noted that AND gate 131 and enable input terminal 124 provide a means for enabling or disabling modification stage 121 and are not limitations of the present invention, i.e., control input terminal 123 can be commonly connected to the second input terminal of AND gate 132 and to the first input terminal of AND gate 133.

In operation, reference input terminal 38 receives a signal REFERENCE and feedback input terminal 39 receives a signal FEEDBACK. Phase detector stage 47 captures selected edges of signal REFERENCE and signal FEEDBACK for subsequent comparison in threshold stage 48. Output terminal Q of flip-flop 103 transmits a signal REFERENCE EDGE and output terminal Q of flip-flop 104 transmits a signal FEEDBACK EDGE. Preferably, signal REFERENCE EDGE and signal FEEDBACK EDGE are initially at a logic low level and the output of delay buffer 106 is at a logic high level, thereby de-asserting terminals $\overline{R}$ of flip-flops 103 and 104. When a rising edge is detected in signal REFERENCE, signal REFERENCE EDGE transitions from a logic low to a logic high. Similarly, when a rising edge is detected in signal FEEDBACK, signal FEEDBACK EDGE transitions from a logic low to a logic high. When both signal REFERENCE EDGE and signal FEEDBACK EDGE are at a logic high, the output terminal of NAND gate 107 is at a logic low. Further, after a time delay from buffer 106, input terminal $\overline{R}$ of flip-flop 103 and input terminal $\overline{R}$ of flip-flop 104 are at a logic low, thereby resetting flip-flops 103 and 104 so that signal REFERENCE EDGE and signal FEEDBACK EDGE are each at a logic low.

Referring to threshold stage 48, the output terminal of XOR gate 114 transmits a signal LEADING EDGE and the output terminal of OR gate 116 transmits a signal THRESHOLD. When the rising edge of signal FEEDBACK lags the rising edge of signal REFERENCE, signal REFERENCE EDGE is at a logic high and signal FEEDBACK EDGE is at a logic low. Therefore, signal LEADING EDGE is at a logic high and signal THRESHOLD is at a logic high. If signal THRESHOLD remains at a logic high and propagates through buffer 113 before signal FEEDBACK EDGE transitions to a logic high, then control output terminal 57 transitions to a logic high. Control output terminal 57 at a logic high indicates that the phase difference between the rising edges of signal REFERENCE and signal FEEDBACK is greater than a predetermined value, where the predetermined value is determined by the time delay of buffer 113. The predetermined value is altered by altering the time delay of buffer 113. In this example, the time delay of buffer 113 is increased by adding pairs of inverters in series with the plurality of inverters of buffer 113 and the time delay of buffer 113 is decreased by removing pairs of inverters from buffer 113. Alternatively, if delay buffer 113 were comprised of a plurality of non-inverting buffers, then the time delay of buffer 113 is increased or decreased by adding or subtracting at least one non-inverting buffer. It should be noted that like delay buffer 113, delay buffers 106, 111, 112, 134, and 136 can also be comprised of a plurality of inverters.

In another example, when the rising edge of signal REFERENCE lags the rising edge of signal FEEDBACK, signal FEEDBACK EDGE is at a logic high and signal REFERENCE EDGE is at a logic low. Therefore, signal LEADING EDGE is at a logic high and signal THRESHOLD is at a logic high. If signal THRESHOLD remains at a logic high and propagates through buffer 113 before signal REFERENCE EDGE transitions to a logic high, then control output terminal 57 transitions to a logic high. This indicates that the phase difference between the rising edges of signal REFERENCE and signal FEEDBACK is greater than the predetermined value determined by the delay of buffer 113. On the other hand, if signal THRESHOLD is at a logic high and does not propagate through buffer 113 before signal REFERENCE EDGE transitions to a logic high, then signal LEADING EDGE transitions to a logic low and control output terminal 57 stays at a logic low.

Preferably, the time delay of buffer 111 and the time delay of buffer 112 are each greater than the time delay of buffer 113 to ensure that the state of control output terminal 57 is determined before signal REFERENCE EDGE and signal FEEDBACK EDGE are respectively transmitted to input terminals 122 and 123 of modification stage 121. Delay buffers 111 and 112 could be included in phase detector stage 47 instead of threshold stage 48 as illustrated. In addition, it is preferable that the time delay of buffer 106 be greater than the time delay of buffer 113 to ensure that threshold stage 48 compares the phase difference between signal REFERENCE and signal FEEDBACK before flip-flops 103 and 104 are reset.

Referring to modification stage 121, the output terminal of OR gate 137 transmits a signal PLL REFERENCE to reference input terminal 43 and the output of OR gate 138 transmits a signal PLL FEEDBACK to feedback input terminal 44. When enable input terminal 124 is set to a logic low by an external control device (not shown), the output terminals of AND gates 132 and 133 are at a logic low and signal REFERENCE EDGE and signal FEEDBACK EDGE are transmitted to output terminals 41 and 42. Therefore, the phase difference between the rising edges of signal REFERENCE and signal FEEDBACK are essentially equal to the phase difference between the rising edges of signal PLL REFERENCE and signal PLL FEEDBACK.

When control input terminal 123 is at a logic low and enable input terminal 124 is at a logic high, the output terminals of AND gates 132 and 133 are at a logic low and signal REFERENCE EDGE and signal FEEDBACK EDGE are transmitted to output terminals 41 and 42. The phase difference between the rising edges of signal REFERENCE and signal FEEDBACK are essentially equal to the phase difference between the rising edges of signal PLL REFERENCE and signal PLL FEEDBACK.

When control input terminal 123 is at a logic high and enable input terminal 124 is at a logic high, the output terminal of AND gate 131 is at a logic high. When signal REFERENCE leads signal FEEDBACK and the output terminal of AND gate 131 is at a logic high, signal REFERENCE EDGE is at a logic high and the output terminals of OR gate 137 and AND gate 132 are at a logic high. The logic one signal at the output terminal of AND gate 132 propagates to the output terminal of OR gate 138 after a time delay approximately equal to the combined time delays of buffer 134 and OR gate 138. Therefore, when the phase differences between the rising edges of signals REFERENCE and FEEDBACK is greater than a predetermined value, the phase difference between the rising edges of signals PLL REFERENCE and PLL FEEDBACK is less than the phase difference between the rising edges of signals REFERENCE and FEEDBACK. In this example, the rising edge of signal PLL FEEDBACK lags the rising edge of signal PLL REFERENCE by an amount of time approximately equal to the combined time delays of buffer 134 and AND gate 132.

When signal REFERENCE lags signal FEEDBACK and the output terminal of AND gate 131 is at a logic high, signal FEEDBACK EDGE is at a logic high and the output terminals of OR gate 138 and AND gate 133 are at a logic high. The logic one signal at the output terminal of AND gate 133 propagates to the output terminal of OR gate 137 after a time delay approximately equal to the combined time delays of buffer 136 and AND gate 133. Therefore, the rising edge of signal PLL REFERENCE lags the rising edge of signal PLL FEEDBACK by an amount of time approximately equal to the combined time delays of buffer 136 and AND gate 133.

Delay buffers 134 and 136 determine the phase difference between the rising edges of signal PLL REFERENCE and signal PLL FEEDBACK when the phase difference between the rising edges of signal REFERENCE and signal FEEDBACK is greater than a predetermined value. The phase difference between the rising edges of signal PLL REFERENCE and signal PLL FEEDBACK can be altered by altering the delay of either or both buffers 134 and 136. It should be noted that delay buffers 134 and 136 are optional elements of modification stage 121. Without buffers 134 and 136, when signal FEEDBACK lags signal REFERENCE and the phase difference between signal FEEDBACK and signal REFERENCE is greater than a predetermined value, the rising edge of signal PLL FEEDBACK will lag the rising edge of signal PLL REFERENCE by an amount of time approximately equal to the time delay of AND gate 132.

By now it should be appreciated that a PLL system and a method for modifying the output transition time of the PLL system have been provided. An advantage of the present invention is that it decreases the phase difference between two signals having a phase difference greater than a predetermined value. Another advantage of the present invention is that it provides an input stage that can be coupled to a prior art PLL without substantially altering the gain or the operating bandwidth of the PLL.

What is claimed is:

1. A phase-locked loop system, comprising:
   a phase detector stage for determining a phase difference between first and second input signals;
   a threshold stage coupled to the phase detector stage for asserting a control signal after the phase difference is greater than a predetermined value;
   a modification stage coupled to the threshold stage for receiving the control signal and for altering the phase difference between the first and second input signals after the phase difference is greater than the predetermined value, without altering a frequency of the first input signal and without altering a frequency of the second input signal; and
   a phase-locked loop having an input coupled to the modification stage and an output coupled to the phase detector stage.

2. The phase-locked loop system of claim 1, wherein the phase detector stage comprises:
   a first flip-flop having a first input coupled for receiving a source of operating potential, a second input coupled to a first input of the phase detector stage, and an output coupled to a first output of the phase detector stage;
   a second flip-flop having a first input coupled for receiving the source of operating potential, a second input coupled to a second input of the phase detector stage, a third input coupled to a third input of the first flip-flop, and an output coupled to a second output of the phase detector stage;
   a NAND gate having a first input coupled to the output of the first flip-flop and a second input coupled to the output of the second flip-flop; and
   a delay buffer having an input coupled to an output of the NAND gate and an output coupled to the third input of the first flip-flop and coupled to the third input of the second flip-flop.

3. The phase-locked loop system of claim 2, wherein the first and second flip-flops are D-type flip flops.

4. The phase-locked loop system of claim 1, wherein the threshold stage comprises:
   an exclusive-OR (XOR) gate having a first input coupled to a first input of the threshold stage and a second input coupled to a second input of the threshold stage;
   an OR gate having a first input coupled to the first input of the threshold stage and a second input coupled to the second input of the threshold stage;
   a flip-flop having a first input coupled to an output of the XOR gate, a second input coupled for receiving a source of operating potential, and an output coupled to an output of the threshold stage; and
   a delay buffer having an input coupled to an output of the OR gate and an output coupled to a third input of the flip-flop.

5. The phase-locked loop system of claim 4, wherein the delay buffer is comprised of a plurality of inverters.

6. The phase-locked loop system of claim 4, herein the flip-flop is a D-type flip-flop.

7. The phase-locked loop system of claim 1, wherein the modification stage comprises:
   a first AND gate having a first input coupled to a first input of the modification stage;
   a second AND gate having a first input coupled to a second input of the first AND gate and a second input coupled to a second input of the modification stage;
   a first OR gate having a first input coupled to the first input of the modification stage, a second input coupled to an output of the second AND gate, and an output coupled to a first output of the modification stage; and
   a second OR gate having a first input coupled to an output of the first AND gate, a second input coupled to the second input of the modification stage, and an output coupled to a second output of the modification stage.

8. The phase-locked loop system of claim 7, wherein the first input of the second OR gate is coupled to the output of the first AND gate via a first delay buffer and wherein the second input of the first OR gate is coupled to the output of the second AND gate via a second delay buffer.

9. The phase-locked loop system of claim 7, wherein the modification stage further includes an enable input.

10. The phase-locked loop system of claim 1, wherein the output of the phase-locked loop is coupled to the phase detector stage via a loop divider.

11. The phase-locked loop system of claim 1, wherein the phase-locked loop comprises:
   a phase detector having a first input coupled to the input of the phase-locked loop and a second input coupled to a second input of the phase-locked loop;
   a loop filter having an input coupled to an output of the phase detector; and
   a voltage-controlled oscillator having an input coupled to an output of the loop filter and an output coupled to the output of the phase-locked loop.

12. A method for modifying an output transition time of a Phase-Locked Loop (PLL) system, comprising the steps of:
   determining a phase difference between a reference signal and a feedback signal;
   asserting a control signal when the phase difference is greater than a predetermined value; and
   altering the predetermined value, wherein the step of altering the predetermined value includes increasing the predetermined value by increasing a time delay of a delay buffer.

13. The method of claim 12, further including the step of modifying the phase difference between the reference signal and the feedback signal when the control signal is asserted.

14. The method of claim 13, wherein the step of modifying the phase difference between the reference signal and the feedback signal includes decreasing the phase difference between the reference signal and the feedback signal when the control signal is asserted.

15. A method for modifying a slew rate of an output signal of a Phase-Locked Loop (PLL) system having an input stage, comprising the steps of:
   determining a phase difference between a reference signal and a feedback signal;
   asserting a control signal after the phase difference is greater than a predetermined value;
   decreasing the phase difference between the reference signal and the feedback signal when the control signal is asserted, without altering a frequency of the reference signal and without altering a frequency of the feedback signal;
   generating the feedback signal from the output signal; and
   using a PLL to change the frequency of the output signal whereby, the input stage increases an output transition time of the PLL system.

16. The method of claim 15, further including the step of altering the predetermined value.

17. The method of claim 16, wherein step of altering the predetermined value includes decreasing the predetermined value by decreasing a time delay of a delay buffer.

18. The phase-locked loop system of claim 4, further including:
   a second delay buffer having an input coupled to the first input of the threshold stage and an output coupled to a second output of the threshold stage; and
   a third delay buffer having an input coupled to the second input of the threshold stage and an output coupled to a third output of the threshold stage.

19. A phase-locked loop system, comprising:
   a phase detector stage for providing first and second signals;
   a threshold stage having a first input for receiving the first signal, a second input for receiving the second signal, a first output for transmitting the first signal, and a second output for transmitting the second signal;
   a modification stage having a first input coupled to the first output of the threshold stage for receiving the first signal and a second input coupled to the second output of the threshold stage for receiving the second signal; and
   a phase-locked loop having an input coupled to an output of the modification stage and an output coupled to an input of the phase detector stage.

* * * * *